INTERCONNECTION OF FLEXIBLE ELECTRICAL CIRCUITS

Filed April 1, 1969 3 Sheets-Sheet 1

INVENTORS.
RICHARD H. HEALY
WILLIAM L. PALMER
BY George C. Sullivan
Agent
H. Donald Volk
Attorney Nov. 3, 1970 R. H. HEALY ET AL 3,537,176

INTERCONNECTION OF FLEXIBLE ELECTRICAL CIRCUITS

Filed April 1, 1969 3 Sheets-Sheet 2

INVENTORS.
RICHARD H. HEALY
WILLIAM L. PALMER
BY George C. Sullivan
Agent
H. Donald Volk
Attorney

INTERCONNECTION OF FLEXIBLE ELECTRICAL CIRCUITS

Filed April 1, 1969 3 Sheets-Sheet 3

INVENTORS.
RICHARD H. HEALY
WILLIAM L. PALMER
BY George [signature] Agent
H. Donald Volk Attorney United States Patent Office 3,537,176

Patented Nov. 3, 1970

3,537,176

INTERCONNECTION OF FLEXIBLE ELECTRICAL CIRCUITS

Richard H. Healy, San Jose, and William L. Palmer, Cupertino, Calif., assignors to Lockheed Aircraft Corporation, Burbank, Calif.

Filed Apr. 1, 1969, Ser. No. 811,842

Int. Cl. H05k 3/36

U.S. Cl. 29—625 4 Claims

ABSTRACT OF THE DISCLOSURE

A method of assembling electrical conductors mounted on flexible insulating support material is disclosed. A conductive coating of solder is first joined to the conductors, then ground flat and a hole formed therethrough. An electrically conductive pin is inserted through the hole and a conductive washer and a solderable locking washer is threaded on the pin. Heat is then applied to melt the coating of solder to solder said electrical conductor to the conductive pin.

BACKGROUND OF THE INVENTION

This invention relates to an improved method of assembling electrical conductors that are mounted on flexible insulating support material, and commonly called flat flexible printed circuitry.

Flexible printed circuitry is usually connected by soldering, brazing, or force fitting a pin to the electrical conductors. Due to increasing complexity, both by greater density of conductors and by increasing the number of stacked flexible printed circuitry layers to be interconnected, many practical problems of assembling have arisen.

Force fit is herein described and includes swaging, upsetting and piercing of conductors or leads. Force fit as a means of interconnecting multiple layers, flexible circuitry is unsatisfactory because of the possibility of incurring corrosion in high humidity environments. Moreover the expansion and contraction of conductors and interconnecting leads causes changes in electric characteristics of the electrical circuit, thereby rendering it useless in many applications.

Hand soldering a plurality of stacked flexible circuitry, one layer at a time, is unsatisfactory because the heat applied to solder one joint may inadvertently unsolder previously soldered joints connected to the same lead, pin, or terminal.

To overcome this problem, prior art has used preformed pieces of solder (commonly referred to as "preforms"). Preforms give unsatisfactory results because open circuits occur due to poor wetting of the surfaces to be joined. This lack of wetting may occur because of inadequate cleaning of the parts to be joined or improper handling after cleaning. An open circuit deep in the stack of flexible circuitry layers is very difficult to repair; therefore obtaining reliable soldered interconnects repeatedly the first time is essential to successful operation of a stacked flat flexible circuitry assembly.

SUMMARY OF THE INVENTION

The present invention alleviates the problems encountered in the prior art by predepositing solder in bead form on the conductors, truncating the solder bead to a predetermined thickness, placing a hole in the solder bead, inserting a soldered coated lead through the conductor and holding the assembled layers with a solderable shrink-fit hold down washer prior to soldering.

The specific nature of the invention, as well as the objects, uses, and advantages will be readily appreciated and understood with reference to the accompanying drawings.

Figure 1:
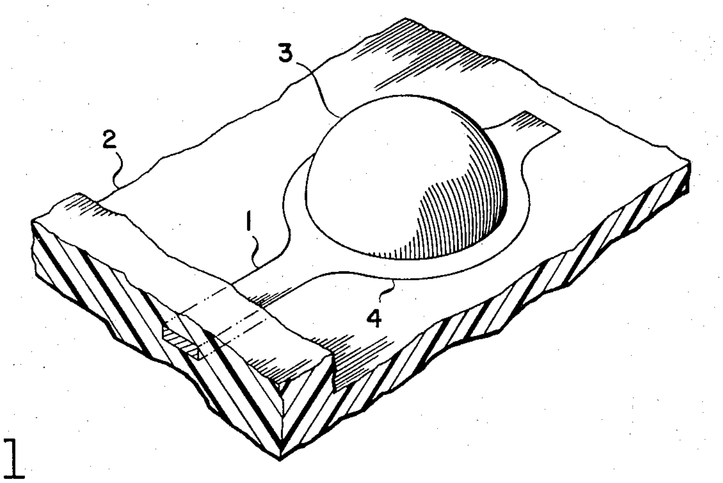
FIG. 1 is a fragmentary view of an insulated printed circuit trace after a solder bead has been applied.
Figure 2:
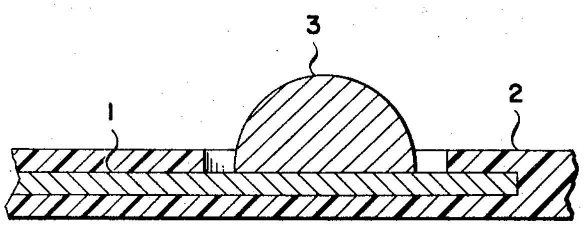
FIG. 2 is a cross sectional elevation showing the printed circuit trace and solder bead of FIG. 1.

Referring now in detail to FIG. 1 and FIG. 2, a printed circuit trace 1 is supported by encasing insulation 2. The insulation has been removed from a portion of one side of the trace to expose the interconnect pad 4. The insulation can be removed by any well known method such as chemical etching through the insulation or mechanically milling off the insulation.

Once the insulation is removed from the surface conductor by any well known mechanical or chemical means, a solder bead 3 is formed on the conductor. This is done by dipping the prefluxed circuit pad into a bath of molten solder followed by rapid withdrawal. If the solder bead fails to adhere to the conductor, the conductor can be easily recleaned with an abrasive eraser or any other well known means and then redipped as stated above or manually resoldered.

The top of the solder bead is then cut off to a predetermined height, using any well known commonly available technique. Manual techniques include passing an abrasive material or file over the beads which have been previously positioned between parallel surfaces. Machine techniques include, but are not limited to, planing machines.

Figure 3:
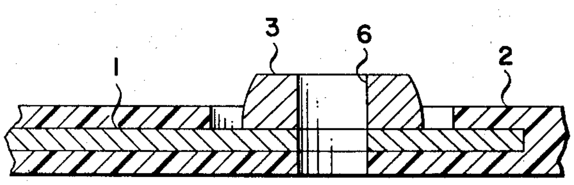
FIG. 3 is a cross sectional elevation of the finished printed circuit trace and solder bead of FIG. 1.

After the top of the solder bead is leveled, a hole 6 is punched or drilled through the solder head 3, the interconnect pad 4 and the insulation 2. FIG. 3 shows the apparatus after this operation has been completed.

Figure 4:
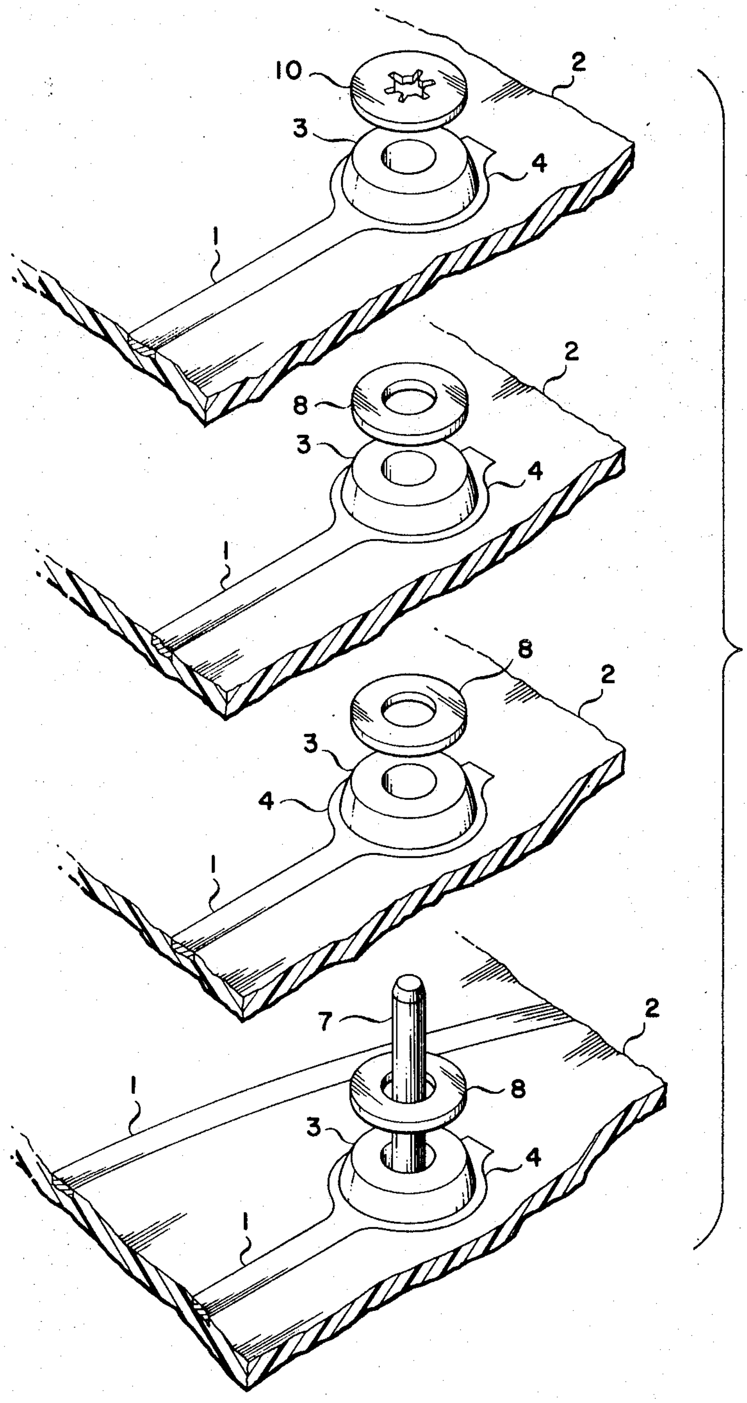
FIG. 4 is an exploded perspective view illustrating interconnecting printed circuit traces that are mounted on layers of flexible insulating support.

FIG. 4 shows, in exploded perspective, how a plurality of printed circuit traces are interconnected. An electrically conductive pin 7, which is inserted through the hole 6 of the solder bead, interconnects the printed circuit traces. Pin 7 may be made of copper or any other rigid conductive material. If desired, pin 7 can be precoated with solder to improve its solderability.

A solderable conductive spacer 8, which is threaded on pin 7, serves as a spacer between the juxtapositioned pads 4 and also serves to enhance the capillary flow of melted solder. The conductive spacer 8 may be tin or lead plated, or solid copper or any other readily solderable material. The size of the aperture in the spacer 8 is chosen so that there is approximately a 0.003 inch clearance between the inside diameter of the spacer 8 and the cylindrical surface of the pin 7. It has been found that this space forms an excellent capillary path for solder to flow and form a solid mechanical and electrical connection between the pads 4, pin 7 and the spacer 8.

As can be seen in FIG. 4, the pads 4 and spacers 8 are alternately threaded onto pin 7 until the desired number of layers have been installed. The whole assembly is then held rigid by inserting a hold down washer 10 on pin 7 over the top pad 4. The inside portion of the hold down washer 10 is star shaped and so sized that a shrink fit is achieved when the hold down washer 10 is inserted on the pin 7 by a hollow tube insertion tool or any other well known means.

Figure 5:
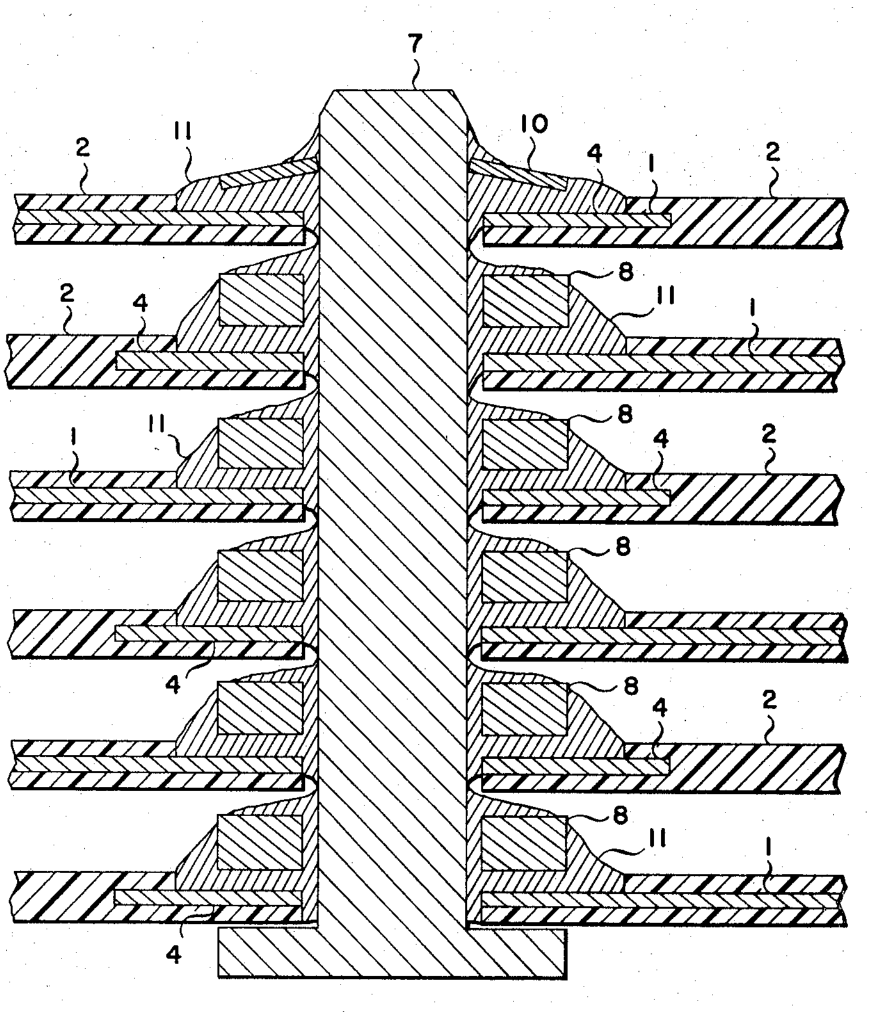
FIG. 5 is a cross sectional view of the completed assembly illustrating how the truncated solder beads have melted to electrically and mechanically connect the printed circuit traces of each layer to the central pin.

FIG. 5 shows a cross sectional view of an assembly similar to that shown in FIG. 4 after heat has been applied to melt the truncated solder beads and complete the electrical interconnection of the assembly. When the assembly is heated, the solder, through capillary action, climbs between each conductive spacer 8 and the pin 7 to make a good electrical and mechanical connection. Spacer 8 in cooperation with pads 4 and pin 7 assures that the solder only has to act as a bond between parallel surfaces and not merely act as a filler between perpendicular surfaces as in the prior art.

While we have shown and described the novel features of the invention as applied to the preferred embodiment, it will be understood that various omissions, substitutions, and changes in the form and details of the device illustrated may be made by those having ordinary skill in the art without departing from the spirit of the invention. It is intended, therefore, to be limited only as indicated by the scope of the following claims.

We claim:

1. A method of assembling electrical conductors mounted on a flexible insulating support comprising:
- forming a solder coating on the conductors to be joined by dipping said conductors in molted solder to form beads of solder on the conductors,
- grinding said beads of solder flat to a predetermined thickness,
- forming a hole through at least one solder coated conductor,
- inserting into said hole an electrically conductive means having a coating of solder thereon,
- threading a conductive washer on said electrically conductive means juxtapositioned to said conductor,
- threading a solderable locking washer means on said electrically conductive means so that said locking washer means is in contact with the said solder coating on said conductor, and
- applying heat to said electrically conductive means to melt said coating of solder and solder said electrical conductor to said electrically conductive means.

2. The method set forth in claim 1 in which said electrically conductive means is further defined as made of copper.

3. A method of assembling a plurality of electrical conductors mounted on a plurality of flexible insulating supports comprising:
- forming a solder coating on at least a first and second conductor mounted on at least a first and second flexible insulating support, respectively,
- grinding said beads of solder substantially flat to a predetermined thickness,
- forming a first and second hole through said first and second conductors, respectively,
- inserting an electrically conductive means into said first hole of said first conductor,
- threading a first conductive washer on said electrically conductive means juxtapositioned to said first conductor,
- inserting said electrically conductive means into said second hole of said second conductor,
- threading a second conductive washer on said electrically conductive means juxtapositioned to said second conductor,
- threading a solderable locking washer means on said electrically conductive means so that said locking washer means is in contact with the said solder coating on said conductor, and
- melting said coating of solder on said electrically conductive means so that said first and second conductor are soldered to said electrically conductive means.

4. The method set forth in claim 3 in which said electrically conductive means is made of copper.

References Cited

UNITED STATES PATENTS

| | | | |
|---|---|---|---|
| 2,586,854 | 2/1952 | Myers. | |
| 3,184,830 | 5/1965 | Lane et al. | 174—68.5 XR |

DARRELL L. CLAY, Primary Examiner

U.S. Cl. X.R.

174—68.5; 317—101